(12) United States Patent
Kubo

(10) Patent No.: US 7,699,438 B2
(45) Date of Patent: Apr. 20, 2010

(54) INKJET HEAD AND CONNECTION STRUCTURE OF WIRING BOARD

(75) Inventor: Tomoyuki Kubo, Nagoya (JP)

(73) Assignee: Brother Kogyo Kabushiki Kaisha, Nagoya-shi, Aichi-ken (JP)

( * ) Notice: Subject to any disclaimer, the term of this patent is extended or adjusted under 35 U.S.C. 154(b) by 884 days.

(21) Appl. No.: 11/426,424

(22) Filed: Jun. 26, 2006

(65) Prior Publication Data

US 2007/0002102 A1    Jan. 4, 2007

(30) Foreign Application Priority Data

Jun. 30, 2005    (JP) .............................. 2005-192368

(51) Int. Cl.
  *B41J 2/14*    (2006.01)
(52) U.S. Cl. .............................. 347/50; 347/58; 347/68
(58) Field of Classification Search .................. 347/50, 347/58, 68, 57
See application file for complete search history.

(56) References Cited

U.S. PATENT DOCUMENTS

2003/0112298 A1 * 6/2003 Sato et al. ...................... 347/68
2004/0060969 A1     4/2004 Imai et al.

FOREIGN PATENT DOCUMENTS

| JP | 59 36268 | 3/1984 |
|---|---|---|
| JP | 59-36268 | * 7/1984 |
| JP | H3 48491 | 3/1991 |
| JP | H7 263849 | 10/1995 |
| JP | H11 340615 | 12/1999 |
| JP | 2004 114609 | 4/2004 |

* cited by examiner

*Primary Examiner*—Matthew Luu
*Assistant Examiner*—Henok Legesse
(74) *Attorney, Agent, or Firm*—Baker Botts, LLP

(57) ABSTRACT

A plurality of land sections, each enclosed by two slits, are formed in a ground wire provided on a side of a flexible wiring board to which a piezoelectric element is connected. Since the ground wire and the land sections are connected by only a thin connection section, the solder deposited on the land sections does not flow to the ground wire.

10 Claims, 10 Drawing Sheets

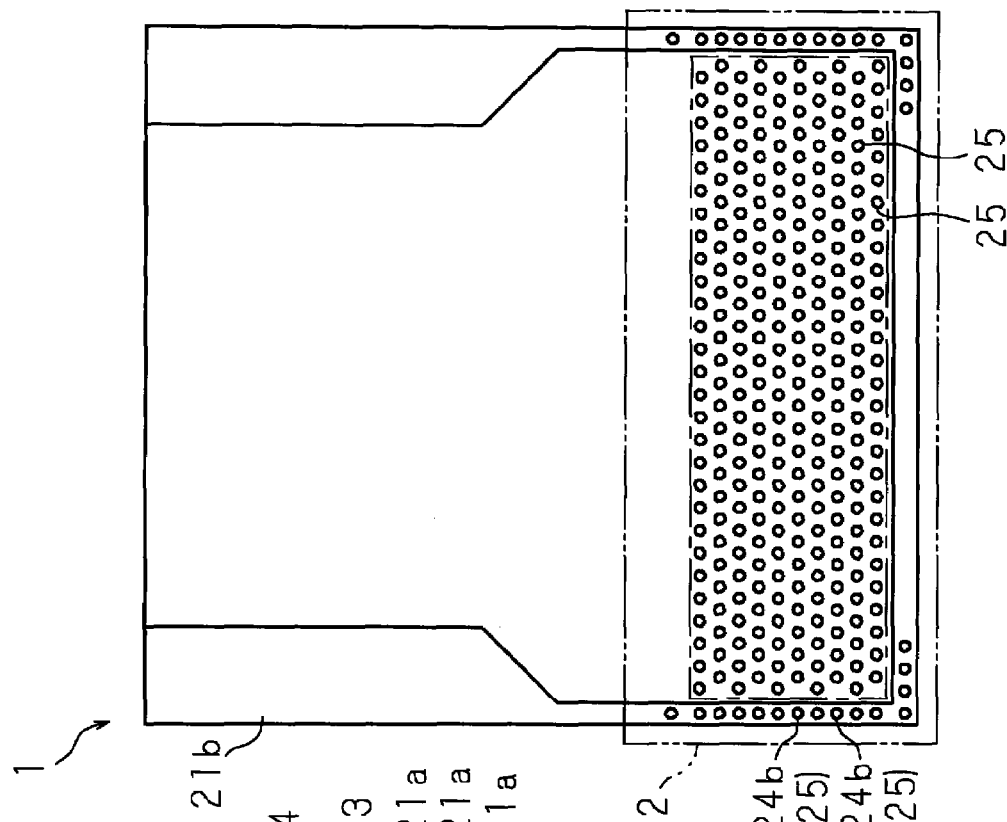
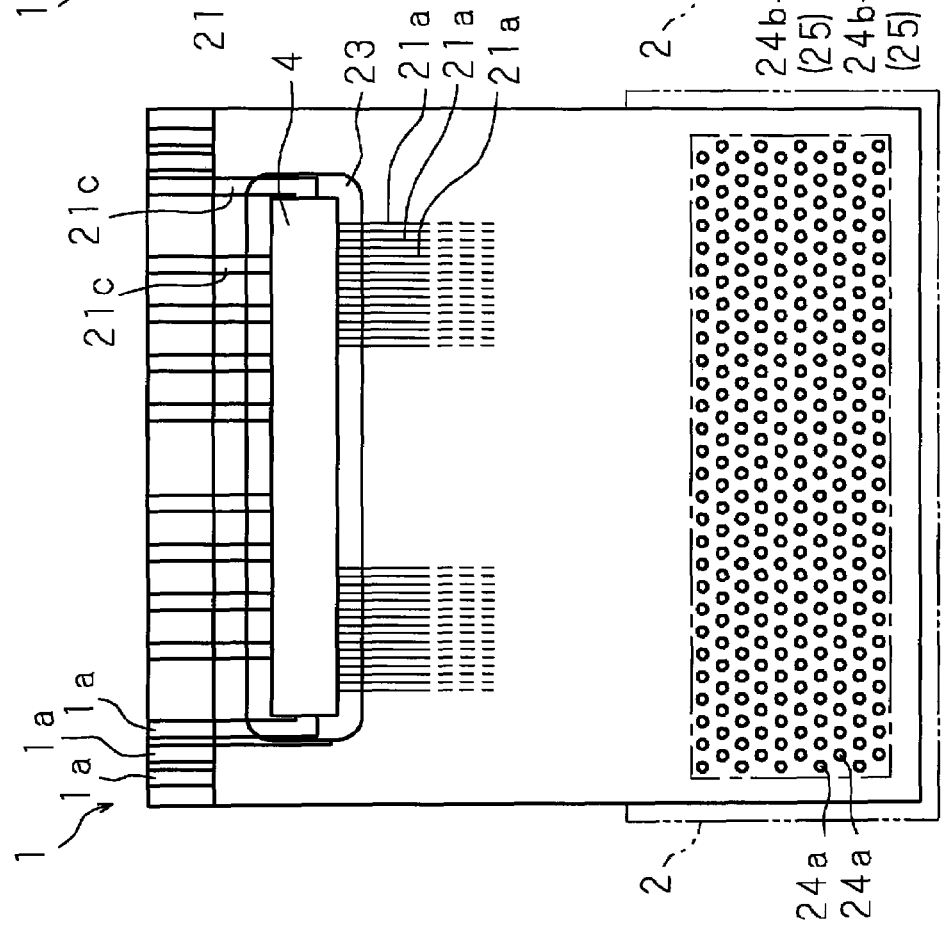
FIG. 3A
FIG. 3B

INKJET HEAD AND CONNECTION STRUCTURE OF WIRING BOARD

CROSS-REFERENCE TO RELATED APPLICATION

This non-provisional application claims priority under 35 U.S.C. §119(a) on Patent Application No. 2005-192368 filed in Japan on Jun. 30, 2005, the entire contents of which are hereby incorporated by reference.

BACKGROUND

The present invention relates to an inkjet head that ejects an ink from a plurality of ejection outlets by pressure generated by a piezoelectric element when a drive element drives the piezoelectric element through a wiring board.

In an inkjet printer, color printing is performed using a plurality of ink cartridges, such as cyan, magenta, yellow and black cartridges, and inks supplied from a plurality of ink cartridges are ejected from a plurality of ejection outlets formed in the inkjet head by pressure generated by a piezoelectric element. The piezoelectric element generates pressure according to a drive voltage supplied from a driving IC, and the drive voltage from the driving IC is supplied to the piezoelectric element through a flexible wiring board.

The flexible wiring board is constructed by providing a plurality of wires on one or both surfaces of an insulating film. Using the flexible wiring board for the transmission of a drive voltage, a control signal, etc. is advantageous because it is possible to increase the degree of freedom in mounting an inkjet head in an inkjet printer and decrease the size of the inkjet printer. In recent years, a COF (Chip On Film) comprising a driving IC mounted directly on a flexible wiring board has been put into practical use. Since the COF can shorten the distance from the driving IC to the piezoelectric element, it is possible to reduce the attenuation and delay of the drive voltage, and it is possible to efficiently drive the piezoelectric element.

In a connection structure of a flexible wiring board disclosed in Japanese Patent Application Laid-Open No. 2004-114609, a plurality of terminal lands and wires are formed on one surface of a band-shaped insulating body, through-holes for exposing the terminal lands from the other side are formed in the insulating body, and the terminal section of the piezoelectric element of the inkjet head and the terminal land are connected by solder through the through-hole. In other words, the solder is deposited only on the terminal lands exposed at the other side of the insulating body. Thus, since the terminal lands and the wires on one surface are isolated from the solder by the insulating body, a short circuit of wires due to leakage of solder will never occur.

SUMMARY

In recent years, as a method of improving the quality of printing, an inkjet printer increases the number of ink ejection outlets in an inkjet head. In the case where the number of ejection outlets is increased, in order to make it possible to selectively drive all the piezoelectric elements, it is necessary to increase the number of wires for transmitting a drive voltage from a driving IC to the piezoelectric elements according to the number of the ejection outlets. In this case, since the number of the piezoelectric elements driven at the same time is also increased, a drive current that needs to be supplied simultaneously is also increased.

However, in the connection structure of the flexible wiring board disclosed in the Japanese Patent Application Laid-Open No. 2004-114609, since all the terminal lands and wires are formed on one surface of the insulating body of the flexible wiring board, the number of wires that can be provided within a predetermined area is limited. Thus, when the number of wires is increased, it may be necessary to increase the size of the flexible wiring board. On the other hand, when an enlargement of the size of the flexible wiring board is impossible, even if the problem associated with the number of wires is solved, there is concern about the ability of the wires to supply the drive current.

In order to overcome the problem, it is supposed to provide wires on both surfaces of the flexible wiring board to ensure a wire area, and, for example, the area for the formation of drive wires can be increased by providing a wire for grounding (hereinafter referred to as the ground wire) and a wire for transmitting a drive voltage (hereinafter referred to as the drive wire) on different surfaces. At this time, in order to avoid a short circuit of drive wires, it is preferred to connect the piezoelectric element by exposing a part of the drive wires to the surface where the ground wire is provided. However, if a solder is deposited on the ground wire to connect the ground wire and the piezoelectric element, the melted solder flows and spreads over the wire, and the initial thickness is not obtained. In other words, compared to the solder placed on the drive wire, the thickness of the solder placed on the ground wire is thinner. Therefore, the amount of solder that can contribute to the connection to the piezoelectric element is insufficient, and there is a possibility that the connection strength may be weaker, or the connection may be infeasible.

In order to solve the above problems, it is an object to provide an inkjet head with a wring structure, whereby even when an electrically conductive brazing filler metal connecting the wire and the piezoelectric element is in a melted state and has high fluidity on the wire, it does not spread excessively through the wire.

It is another object to provide a connection structure of a wiring board with a wring structure, whereby even when an electrically conductive brazing filler metal connecting the wire and a member is in a melted state and has high fluidity on the wire, it does not spread excessively through the wire.

It is another object to provide an inkjet head with a wring structure, whereby even when an electrically conductive brazing filler metal connecting the wire and an actuator is in a melted state and has high fluidity on the wire, it does not spread excessively through the wire.

An inkjet head according to a first aspect is an inkjet head comprising: a piezoelectric element with a plurality of connecting terminal sections for producing pressure to eject an ink; a wiring board having an insulating film, a plurality of wires provided on the insulating film, and land sections connected to the wires; and electrically conductive brazing filler metals connecting the terminal sections of the piezoelectric element and the land sections of the wiring board, and characterized in that the wires and the land sections are provided on both surfaces of the insulating film, the piezoelectric element is connected to the land section on one surface of the insulating film through the electrically conductive brazing filler metal, and the land section provided on the one surface is connected to the wire by a connection section thinner than the land section and the wire connected to the land section.

In the first aspect, the land section is connected to the wire provided on a side of the wiring board to which the piezoelectric element is connected through a connection section thinner than the wire and the land section. When an electrically conductive brazing filler metal for connecting the wiring board and the piezoelectric element is provided on the land section, the thin connection section makes it difficult for the melted electrically conductive brazing filler metal to flow from the land section to the wire.

According to the first aspect, since the land section for providing the electrically conductive brazing filler metal is connected to the wire provided on the side of the wiring board to which the piezoelectric element is connected through the connection section thinner than the wire and the land section, there is no possibility that the electrically conductive brazing filler metal may flow to the wire when the electrically conductive brazing filler metal provided on the land section is melted. It is therefore possible to certainly connect the wiring board to the terminal section of the piezoelectric element. Further, it is possible to provide wires on both surfaces of the wiring board, and it is possible to increase the number of drive wires. Thus, since the number of the ink ejection outlets in the inkjet head can be increased, it is possible to perform high-quality printing. Alternatively, since the size of the wiring board can be decreased, it is possible to reduce the cost.

A connection structure of a wiring board according to a second aspect is a connection structure of a wiring board comprising: a member with a plurality of connecting terminal sections; the wiring board having an insulating section, a plurality of wires provided on the insulating section, and land sections connected to the wires; and electrically conductive brazing filler metals for connecting the terminal sections of the member and the land sections of the wiring board respectively, wherein the wires and the land sections are provided on both surfaces of the insulating section, and the member is connected to the land section on one surface of the insulating section through the electrically conductive brazing filler metal, and the land section provided on the one surface is connected to the wire through a connection section thinner than the land section and the wire connected to the land section.

In the second aspect, the land section is connected to the wire provided on a side of the wiring board to which the member is connected through a connection section thinner than the wire and the land section. When an electrically conductive brazing filler metal for connecting the wiring board and the member is provided on the land section, the thin connection section makes it difficult for the melted electrically conductive brazing filler metal to flow from the land section to the wire.

According to the second aspect, since the land section for providing the electrically conductive brazing filler metal is connected to the wire provided on the side Of the wiring board to which the member is connected through the connection section thinner than the wire and the land section, there is no possibility that the electrically conductive brazing filler metal may flow to the wire when the electrically conductive brazing filler metal provided on the land section is melted. It is therefore possible to certainly connect the wiring board to the terminal section of the member. Further, it is possible to provide wires on both surfaces of the wiring board, and it is possible to increase the number of drive wires. Thus, since the size of the wiring board can be decreased, it is possible to reduce the cost.

An inkjet head according to a third aspect is an inkjet head comprising: a member with a plurality of connecting terminal sections; the wiring board having an insulating section, a plurality of wires provided on the insulating section, and land sections connected to the wires; and electrically conductive brazing filler metals for connecting the terminal sections of the member and the land sections of the wiring board respectively, wherein the wires and the land sections are provided on both surfaces of the insulating section, and the member is connected to the land section on one surface of the insulating section through the electrically conductive brazing filler metal, the land section provided on the one surface is connected to the wire through a connection section thinner than the land section and the wire connected to the land section, and the member is an actuator for producing pressure to eject an ink.

In the third aspect, the land section is connected to the wire provided on a side of the wiring board to which the actuator is connected through a connection section thinner than the wire and the land section. When an electrically conductive brazing filler metal for connecting the wiring board and the actuator is provided on the land section, the thin connection section makes it difficult for the melted electrically conductive brazing filler metal to flow from the land section to the wire.

According to the third aspect, since the land section for providing the electrically conductive brazing filler metal is connected to the wire provided on the side of the wiring board to which the actuator is connected through the connection section thinner than the wire and the land section, there is no possibility that the electrically conductive brazing filler metal may flow to the wire when the electrically conductive brazing filler metal provided on the land section is melted. It is therefore possible to certainly connect the wiring board to the terminal section of the actuator. Further, it is possible to provide wires on both surfaces of the wiring board, and it is possible to increase the number of drive wires. Thus, since the number of the ink ejection outlets in the inkjet head can be increased, it is possible to perform high-quality printing. Alternatively, since the size of the wiring board can be decreased, it is possible to reduce the cost.

The above and further objects and features will more fully be apparent from the following detailed description with accompanying drawings.

BRIEF DESCRIPTION OF THE SEVERAL
VIEWS OF THE DRAWINGS

FIGS. 3A and 3B are plan views showing the structure of a flexible wiring board;

DETAILED DESCRIPTION OF THE
EXEMPLARY EMBODIMENTS

Figure 1:
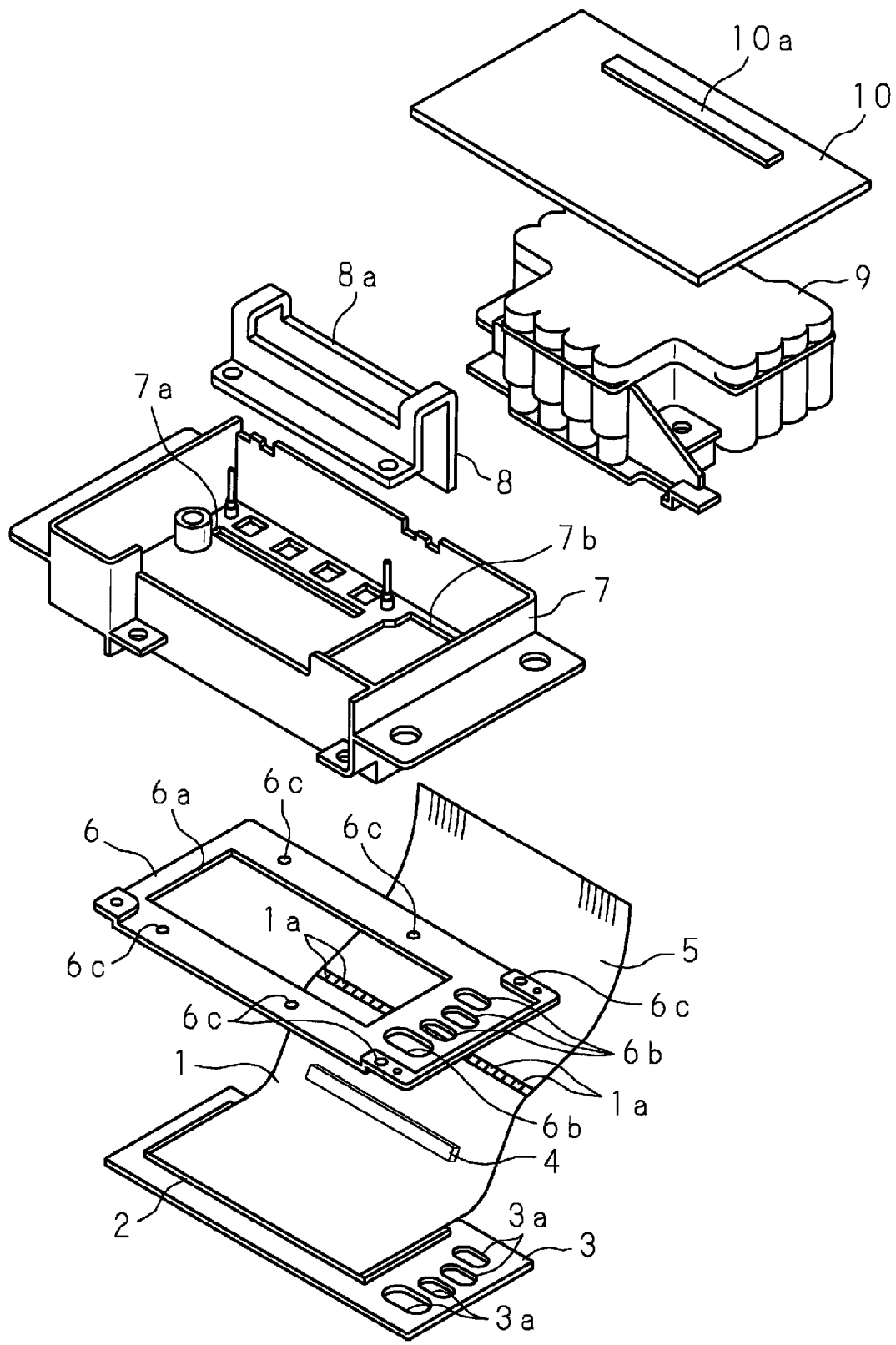
FIG. 1 is an exploded perspective view showing the structure of an inkjet head.

The following description will explain the present embodiment based on the drawings. FIG. 1 is an exploded perspective view showing the structure of an inkjet head; and FIG. 2 is a sectional side view showing the structure of the inkjet head.

Figure 2:
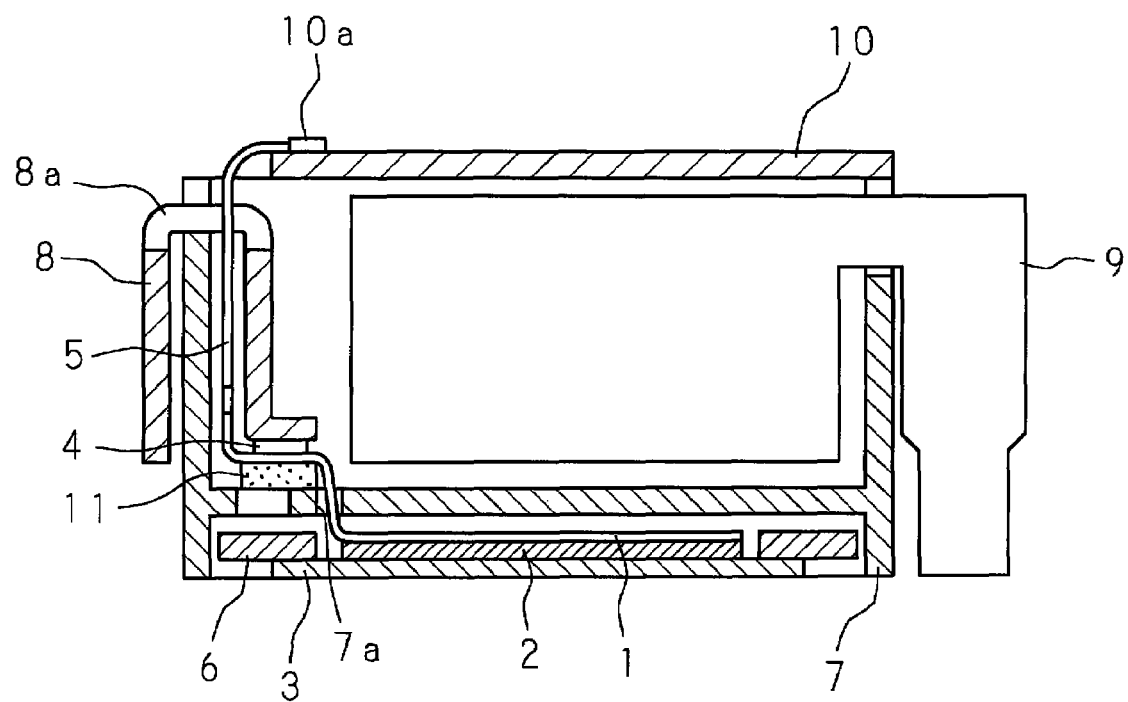
FIG. 2 is a sectional side view showing the structure of the inkjet head.

As shown in FIGS. 1 and 2, the inkjet head has a channel unit 3 that is placed to face a recording medium and ejects an ink. The channel unit 3 is produced by stacking a plurality of metal plates having mutually different shaped through-holes on a resin nozzle plate having a substantially rectangular outside shape and a plurality of ink ejection outlets. The through-holes of the plurality of metal plates are continued one above the other, so that spaces serving as ink channels and ink pressure chambers, etc. are formed in the channel unit 3. An ink channel is provided for each of cyan, magenta, yellow, and black color inks, and an ink pressure chamber is provided on the upper side of the channel unit 3 for each ejection outlet. On one end of a longitudinal direction of the upper surface of the channel unit 3, four ink supply openings, 3a, 3a . . . for supplying an ink to each ink channel are arranged along a short side of the channel unit 3. When the inks are supplied from the ink supply openings 3a, 3a . . . , the inks are distributed to the respective ink pressure chambers through the ink channels and ejected from the ink ejection outlets in the lower surface of the channel unit 3.

A piezoelectric element 2 (actuator) for applying pressure to eject the ink in each ink pressure chamber is bonded to the upper surface of the channel unit 3 by an adhesive. The piezoelectric element 2 is in the form of a substantially rectangular plate smaller than the channel unit 3, and bonded along the longitudinal direction of the channel unit 3 so that it is closer to a short side where the ink supply openings 3a, 3a . . . are not formed. For example, the piezoelectric element 2 is produced by stacking a plurality of $PbTiO_3$—$PbZrO_3$ based ceramic plates. On the upper surface of the piezoelectric element 2, a plurality of individual terminals (terminal sections) corresponding to the respective ink pressure chambers are arranged in a plurality of lines, and a plurality of common terminals to be connected to ground potential are provided to enclose the periphery of the plurality of individual terminals. A drive voltage for applying pressure to eject the ink by deforming the piezoelectric element 2 is applied through the individual terminal to the piezoelectric element 2.

A flexible wiring board 1 in the form of a film having a plurality of wires is connected to the upper surface of the piezoelectric element 2 through solder. The solder connects the individual terminals and common terminals of the piezoelectric element 2 and a plurality of land sections provided on the flexible wiring board 1. The flexible wiring board 1 has a substantially rectangular outside shape with short side slightly shorter than the length of the long side of the piezoelectric element 2. As shown in FIG. 1, the piezoelectric element 2 is connected to one short side of the flexible wiring board 1. On the edge of the other short side of the flexible wiring board 1, a plurality of connection terminals 1a, 1a . . . for connecting a flat cable 5 for relaying the wires are arranged along the short side. Moreover, on the opposite surface of the flexible wiring board 1 to the surface to which the piezoelectric element 2 is connected, a driving IC 4 for producing a drive voltage for driving the piezoelectric element 2 is soldered at the middle position between the piezoelectric element 2 and the connection terminals 1a, 1a . . . .

The driving IC 4 includes a plurality of driving circuits corresponding to the number of ink ejection outlets provided in the channel unit 3. Each driving circuit supplies a drive voltage of around 15 V to 30 V to each individual terminal of the piezoelectric element 2 through the wire formed on the flexible wiring board 1. The piezoelectric element 2 supplied with the drive voltage is displaced, and generates pressure to eject the ink in the corresponding ink pressure chamber.

The flat cable 5 is in the form of a substantially rectangular film, and has one end connected to the connection terminals 1a, 1a . . . of the flexible wiring board 1, and the other end connected to a connector 10a of a circuit board 10 having a control circuit for an inkjet printer. The flat cable 5 includes a plurality of wires tied at both ends, and relays a plurality of control signals for driving the driving IC 4, electric power for the operation of a logic circuit and a drive voltage, etc from the circuit board 10. In other words, these signals and electric power are transmitted through the flat cable 5 to the driving IC 4 mounted on the flexible wiring board 1.

Further, a reinforcement frame 6 in the form of a substantially rectangular plate larger than the channel unit 3 and having a substantially rectangular opening 6a larger than the piezoelectric element 2 is bonded to the upper surface of the channel unit 3 by an adhesive in addition to the piezoelectric element 2. The reinforcement frame 6 is a member for reinforcing the channel unit 3 by surrounding the periphery of the piezoelectric element 2. Moreover, four through-holes 6b, 6b . . . are formed in the reinforcement frame 6, at positions corresponding to the ink supply openings 3a, 3a, . . . of the channel unit 3. Further, a plurality of screw holes 6c, 6c, . . . are arranged along both long sides of the reinforcement frame 6. Note that the piezoelectric element 2 and the flexible wiring board 1 are exposed to the upper side of the reinforcement frame 6 through the opening 6a of the reinforcement frame 6.

The above-explained channel unit 3, piezoelectric element 2, flexible wiring board 1 and reinforcement frame 6 are connected together with an adhesive, solder, etc. and constitute an integrated laminate body. This laminate body is screwed to the lower surface of a resin holder 7 by using the screw holes 6c, 6c . . . of the reinforcement frame 6. Further, the holder 7 has a substantially rectangular parallelepiped shape with open upper surface, and stores an ink buffer tank 9 therein. A slit 7a is formed in the lower surface of the holder 7. As shown in FIG. 2, the flexible wiring board 1 and the flat cable 5 are pulled out from the bottom (lower side) of the holder 7 through the slit 7a. In other words, the flexible wiring board 1 and the flat cable 5 are pulled out from the slit 7a by being bent upward substantially perpendicularly once between the piezoelectric element 2 and the driving IC 4, and further bent upward substantially perpendicularly again and pulled upward after the mount position of the driving IC 4.

Moreover, a heat sink 8 for releasing heat from the driving IC 4 is provided over one side wall of the holder 7. The heat sink 8 is a rectangular metal plate curved into a substantially inverted U shape with one end bent outward substantially perpendicularly. This bent portion is positioned inside the holder 7 and in contact with the driving IC 4. The width of the heat sink 8 in the direction along the side wall of the holder 7 is larger than the length of the short side of the flexible wiring board 1 and the flat cable 5. A notch 8a with a width almost equal to the length of the short side of the flexible wiring board 1 and the flat cable 5 is formed in the upper portion (curved portion) of the heat sink 8.

On the bottom surface of the holder 7, a substantially rectangular parallelepiped rubber cushion member 11 (shown only in FIG. 2) with a length similar to the length of the short side of flexible wiring board 1 is provided to face the lower surface of the bent portion of the heat sink 8. The bent portion of the heat sink 8 and the cushion member 11 sandwich the flexible wiring board 1 and the driving IC 4 therebetween. Thus, the heat generated with the operation of the driving IC 4 is dissipated to the outside of the holder 7 through the heat sink 8.

Further, the flexible wiring board 1 is bent upward substantially perpendicularly between the driving IC 4 and the connection terminals 1a, 1a . . . , and the flat cable 5 connected to the connection terminals 1a, 1a . . . runs upward through a gap between the side wall of the holder 7 and the heat sink 8 and reaches the upper side of the holder 7 through the notch 8a of the heat sink 8.

The respective color inks are supplied from four ink cartridges storing cyan, magenta, yellow, and black inks, respectively, through ink supply tubes (not shown) to the ink buffer tank 9 stored in the holder 7. The ink buffer tank 9 temporarily stores the supplied inks, and supplies the stored inks to the channel unit 3. One substantially rectangular through-hole 7b with a size capable of enclosing the four through-hoes 6b, 6b . . . is formed in the bottom surface of the holder 7, at a position corresponding to the ink supply openings 3a, 3a . . . of the channel unit 3 and the through-holes 6b, 6b . . . of the reinforcement frame 6. The ink buffer tank 9 located in the space above the bottom surface of the holder 7 and the reinforcement frame 6 in space below are joined together through the through-hole 7b. It is therefore possible to supply the inks in the ink buffer tank 9 into the channel unit 3 through the through-holes 6b, 6b . . . of the reinforcement frame 6 and the ink supply openings 3a, 3a . . . of the channel unit 3.

Above the holder 7 storing the ink buffer tank 9, the circuit board 10 is placed to cover the upper surface of the ink buffer tank 9. In this embodiment, the circuit board 10 functions as a lid of the holder 7. The flat cable 5 guided to the top of the holder 7 through the notch 8a of the heat sink 8 is connected to the connector 10a provided on the upper surface of the circuit board 10. Thus, the circuit board 10 and the flexible wiring board 1 are electrically connected.

Figure 4:
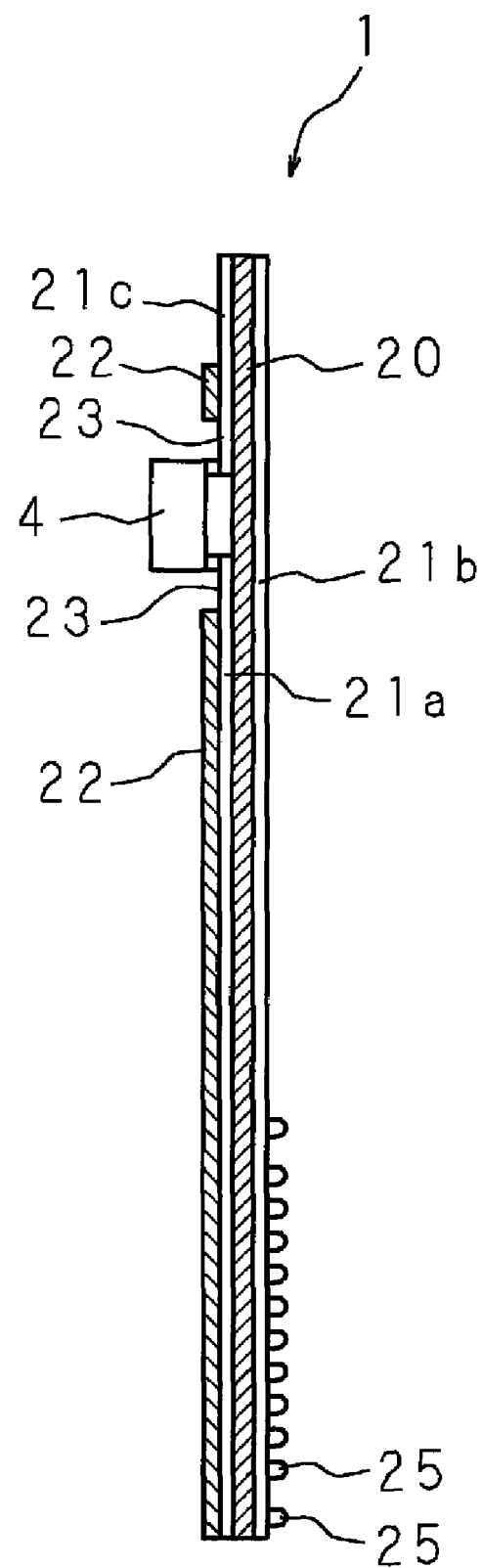
FIG. 4 is a schematic sectional side view showing the structure of the flexible wiring board.

FIGS. 3A and 3B are plan views showing the structure of the flexible wiring board 1. FIG. 3A is a view of the upper surface (the surface to which the driving IC 4 is connected) of the flexible wiring board 1, and FIG. 3B is a view of the lower surface (the surface to which the piezoelectric element 2 is connected). FIG. 4 is a schematic sectional side view showing the structure of the flexible wiring board 1.

The flexible wiring board 1 is a flexible board made of a synthetic resin such as a polyimide resin or a polyester resin, and mainly comprises a substantially rectangular insulating film 20 (insulating section) and a plurality of wires provided on the upper surface and lower surface of the insulating film 20. The wires provided on the upper surface of the insulating film 20 are produced by forming drive wires 21a, 21a . . . for transmitting a drive voltage from the connecting terminals 1a, 1a, . . . to the driving IC 4 and signal wires 21c, 21c . . . for transmitting signals from the driving IC 4 by using a metal such as copper or aluminum. On the lower surface of the insulating film 20, a ground wire 21b to be grounded through any one of the connection terminals 1a, 1a . . . connected to the flat cable 5 is formed by using a metal such as copper or aluminum. The flexible wiring board 1 is a wiring board with two-layer structure. Specifically, as shown in FIG. 3A, a plurality of drive wires 21a, 21a . . . corresponding to the respective ink pressure chambers are provided on the upper surface of the insulating film 20 to which the driving IC 4 is connected. As shown in FIG. 3B, the ground wire 21b is provided on the lower surface of the insulating film 20 to which the piezoelectric element 2 is connected. Further, on the upper surface of the flexible wiring board 1, an insulating membrane 22 of a synthetic resin is formed to cover the drive wires 21a, 21a . . . and the signal wires 21c, 21c . . . . It is therefore possible to prevent an electric short circuit between the drive wrings 21a, 21a . . . and other conductive member on the upper surface of the insulating film 20. The driving IC 4 is soldered to the drive wires 21a, 21a . . . and the signal wires 21c, 21c. . . exposed in an IC connection section 23 that is a portion of the upper surface of the insulating film 20 which is not covered with the insulating membrane 22.

A plurality of signal wires 21c, 21c . . . extend from the respective connection terminals 1a, 1a . . . to the IC connection section 23 along a longitudinal direction of the insulating film 20. The drive wires 21a, 21a . . . are thin wires with a width of about 20 µm or so, and extend from the IC connection section 23 to the opposite side to the connection terminals 1a, 1a . . . (the side to which the piezoelectric element 2 is connected) along the longitudinal direction of the insulating film 20. In this area, as shown in FIG. 3A, several hundreds drive wires 21a, 21a . . . are provided at intervals of about 20 µm or so. The drive wires 21a, 21a . . . are connected to the connection terminals of the driving IC 4 at one end, and connected to a plurality of land sections 24a, 24a . . . for depositing solder at the other end.

Each of the land sections 24a, 24a . . . has a substantially circular shape with a diameter of about 150 µm or so. As shown in FIG. 3A, 28 land sections 24a, 24a . . . are arranged in a line along the direction of the short side of the insulating film 20. 10 lines of land sections 24a, 24a . . . are arranged parallel to each other along the direction of the long side of the insulating film 20 so that the land sections 24a, 24a . . . form a zigzag pattern. The ground wire 21b is formed to enclose three sides of the area where the land sections 24a, 24a . . . are provided (the area indicated by an alternate long and one short dash line in FIGS. 3A and 3B) in the plan view of the flexible wiring board 1.

As explained above, on the upper surface of the flexible wiring board 1, as shown in FIG. 3A, the connection terminals 1a, 1a . . . , the signal wires 21c, 21c . . . running from the connection terminals 1a, 1a . . . to the IC connection section 23, the drive wires 21a, 21a . . . running from the IC connection section 23 to the land sections 24a, 24a . . . , and the land sections 24a, 24a . . . are formed, and the driving IC 4 is mounted in the IC connection section 23 to connect the signal wires 21c, 21c . . . and the drive wires 21a, 21a . . . As shown in FIG. 4, the solder bumps 25, 25 . . . to be deposited on the land sections 24a, 24a . . . are formed so that they pass through the insulating film 20 and stick out from the side to which the piezoelectric element 2 is connected. As shown in FIG. 3B, on the lower surface of the flexible wiring board 1, the solder bumps 25, 25 . . . are formed corresponding to the land sections 24a, 24a . . . , and the ground wire 21b enclosing the solder bumps 25, 25, . . . from three sides are formed. The ground wire 21b is provided on the edge of the insulating film 20.

Figure 5:
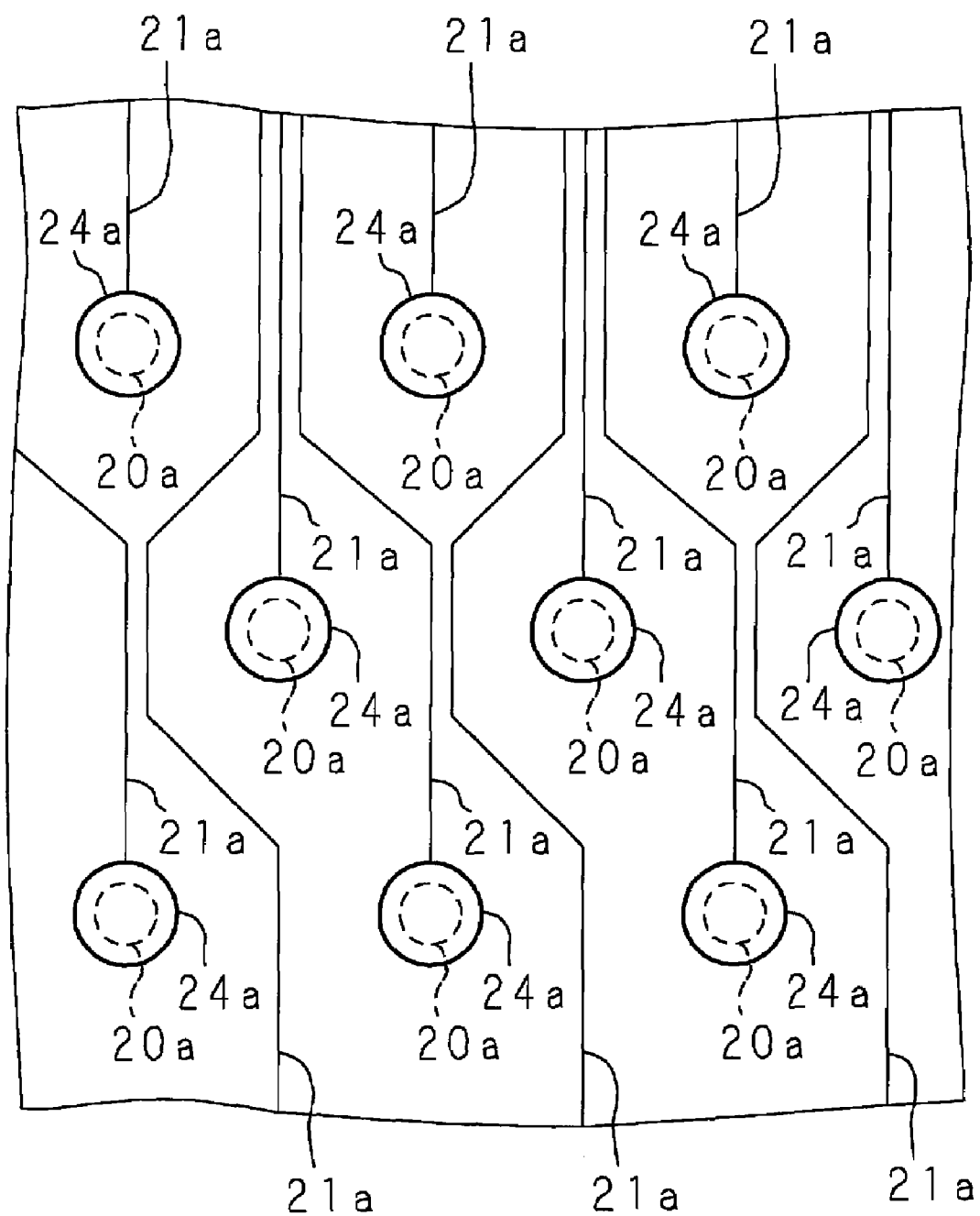
FIG. 5 is an enlarged plan view of the upper surface of the flexible wiring board.

FIG. 5 is an enlarged plan view of the upper surface of the flexible wiring board 1, and illustrates an enlarged view of nine land sections 24a, 24a . . . arranged on the upper surface of the flexible wiring board 1. The land sections 24a, 24a . . . arranged in a zigzag pattern are respectively connected to ends of the respective drive wires 21a, 21a . . . . The drive wires 21a, 21a . . . running through the space between the land sections 24a, 24a . . . located closer to the driving IC 4 are connected to the land sections 24a, 24a. . . located distant from the driving IC 4.

Figure 6:
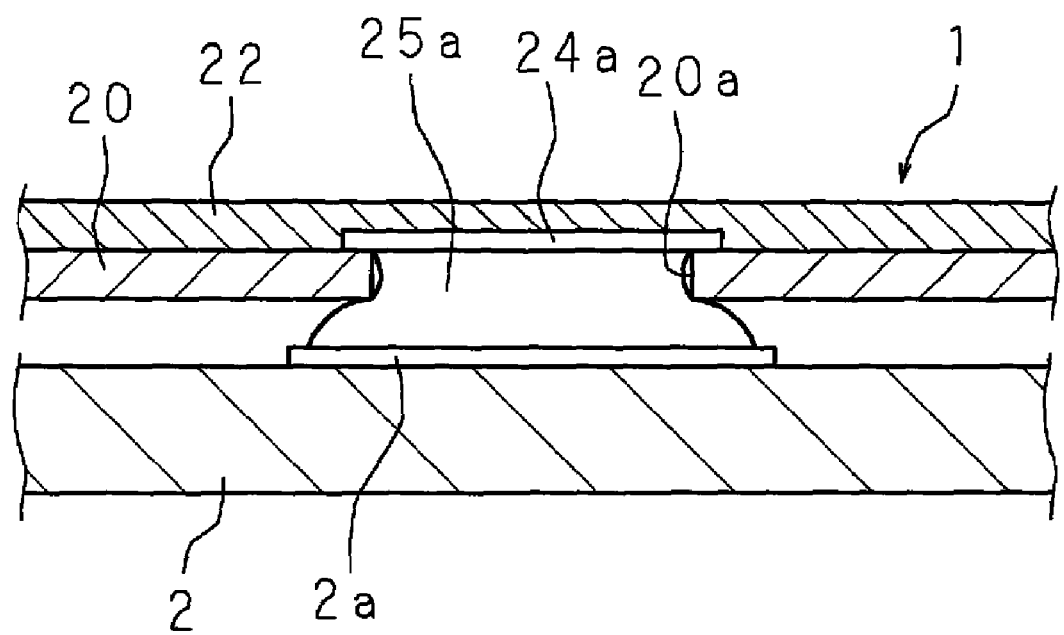
FIG. 6 is an enlarged cross sectional view showing the structure of a connection section between a land section of the flexible wiring board and a piezoelectric element.

FIG. 6 is an enlarged cross sectional view showing the structure of the connection section between the land sections 24a, 24a . . . of the flexible wiring board 1 and the piezoelectric element 2, and illustrates an enlarged view of one of a plurality of land sections 24a, 24a . . . of the flexible wiring board 1.

The through-hole 20a is formed in the insulating film 20 at a position corresponding to the position of the land section 24a on the flexible wiring board 1. The solder bump 25 (see FIG. 4) is formed by depositing a solder 25a (electrically conductive brazing filler metal) on a part of the land section 24a exposed from the through-hole 20a. The deposited solider bump 25 sticks out of the insulating film 20 to a side opposite to the land section 24a. When constructing an inkjet head, the solder bump 25 of the flexible wiring board 1 and the individual terminal 2a of the piezoelectric element 2 are placed to face each other and heated while applying pressure to the flexible wiring board 1. Thus, the land section 24a and the individual terminal 2a are connected through the solder 25a.

The ground wire 21b provided on the lower surface of the flexible wiring board 1 is a wide wire with a width of about several mm to ten and several mm or so, and has such a width that does not cause shortage of power supply even when a drive voltage is applied simultaneously to a plurality of individual terminals 2a. Moreover, the ground wire 21b encloses the periphery of the lower surface of the insulating film 20, except for a short side where the connection terminals 1a, 1a . . . are arranged. In other words, both ends of the ground wire 21b are connected to the connection terminals 1a, 1a . . . located on both ends among the plurality of connection terminals 1a, 1a . . . . The connection terminals 1a, 1a . . . provided on the upper surface of the insulating film 20 and the ground wire 21b provided on the lower surface are connected through a through-hole (not shown) formed in the insulating film 20. Moreover, as shown in FIG. 3B, the ground wire 21b is provided with a plurality of land sections 24b, 24b . . . for forming the solder bumps 25, 25 . . . by depositing solder. The land sections 24b, 24b . . . are arranged in the ground wire 21b along the ground wire 21b.

In this embodiment, the land sections 24b, 24b . . . are arranged to surround the formation area of the solder bumps 25 corresponding to the land sections 24a, 24a . . . from three sides. The solder bumps 25, 25 . . . deposited on the land sections 24b, 24b. . . are arranged so that the sticking height from the insulating film 20 is equal to that of the solder bumps 25, 25 . . . deposited on the land sections 24a, 24 . . . . Therefore, the joined state with respect to the piezoelectric element 2 does not differ depending on locations.

Figure 7:
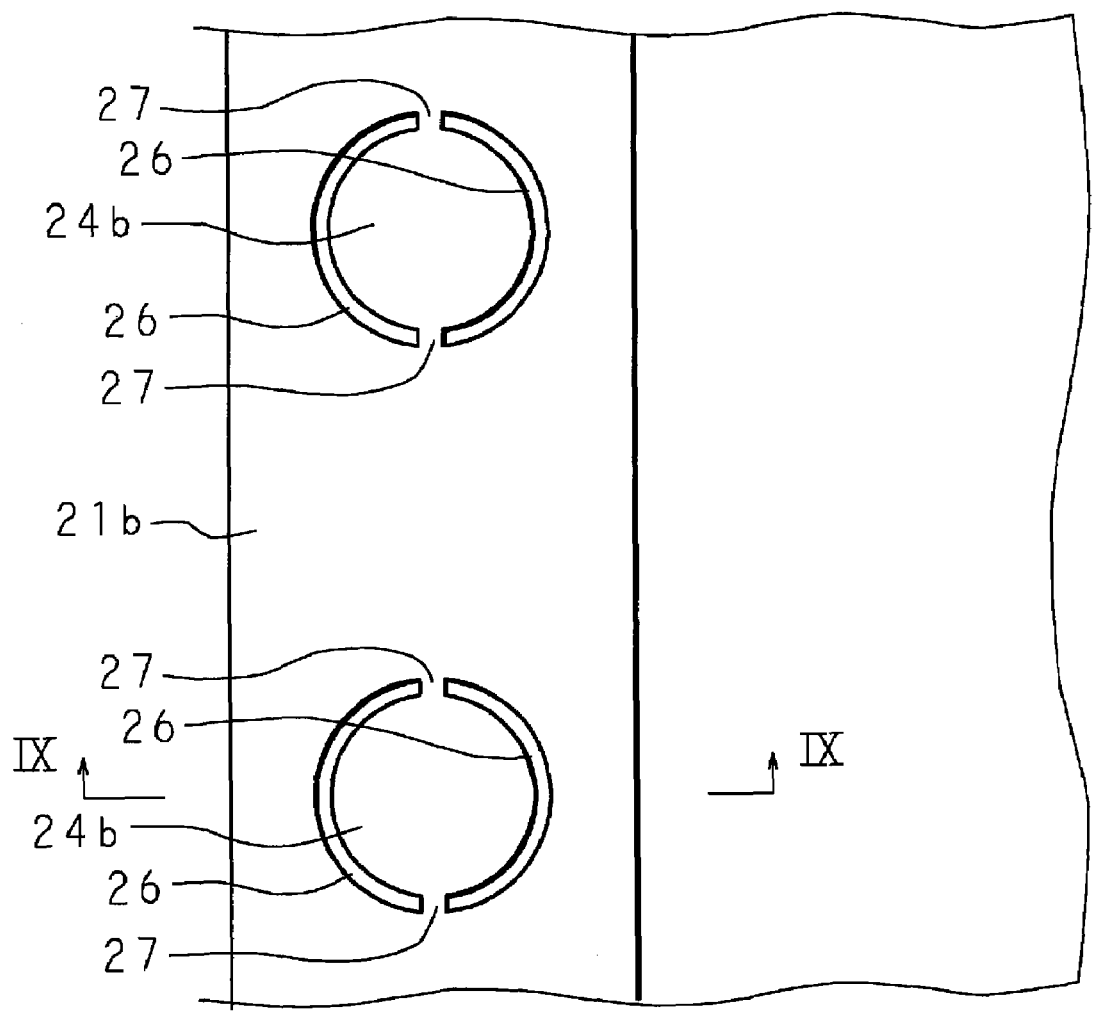
FIG. 7 is an enlarged plan view of the lower surface of the flexible wiring board.
Figure 8:
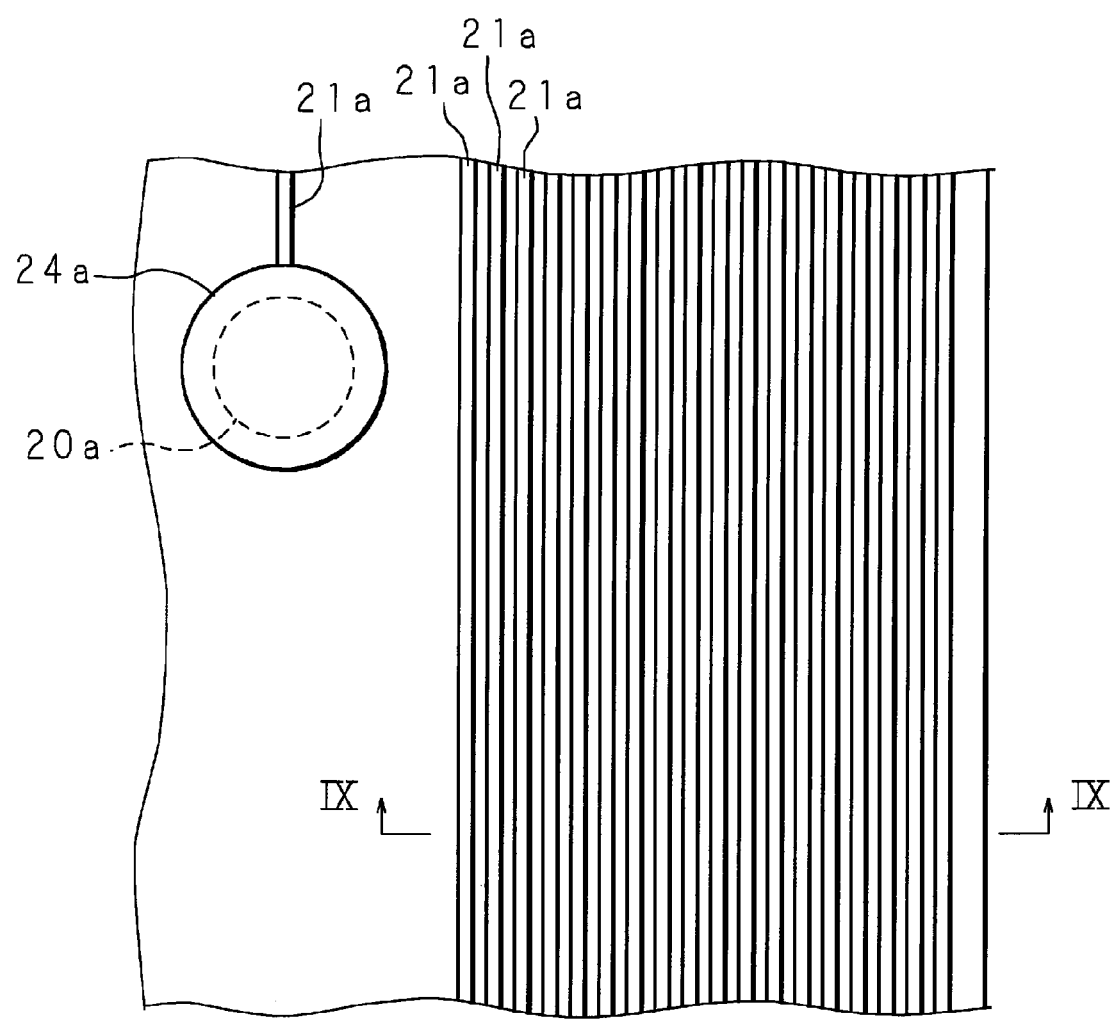
FIG. 8 is an enlarged view of the upper surface of the flexible wiring board corresponding to FIG. 7.

FIG. 7 is an enlarged plan view of the lower surface of the flexible wiring board 1, and illustrates an enlarged view of the vicinity of the land sections 24b, 24b. . . formed on the ground wire 21b. FIG. 8 is an enlarged view of the upper surface of the flexible wiring board 1 corresponding to FIG. 7, and FIG. 9 is a cross sectional view along the IX-IX line of FIGS. 7 and 8.

A ground wire 21b provided on the lower surface of the flexible wiring board 1 has a plurality of slits 26, 26 . . . in the form of a semi-circular arc. The slits 26, 26 . . . are arranged to form pairs by positioning the inner sides of the arcs of two slits 26 and 26 to face each other, so—that a gap (connection section 27) is formed between the ends of the two slits 26 and 26 facing each other. A substantially circular area enclosed by two slits 26, 26 is the land section 24b for forming the solder bump 25 by depositing a solder. By using the gaps between the ends of the two slits 26, 26 facing each other as the connection sections 27, 27, the ground wire 21b and the land sections 24b, 24b . . . are electrically connected.

As shown in FIG. 7, the connection sections 27, 27 . . . are formed at a substantially middle in the width direction of the ground wire 21b, and arranged in one line along the extending direction of the ground wire 21b. Since the length of a portion of the ground wire 21b cut out by the slits 26, 26 . . . in the width direction is shorter, the function of the ground wire 21b as the power supply wire is not restricted. Moreover, the width of the connection sections 27, 27 . . . is sufficiently smaller than the width of the land sections 24b, 24b . . . . Thus, when the solder bumps 25, 25 melt and have high fluidity, they do not spread excessively through the connection sections 27, 27 . . . to the ground wire 21b. Further, the slits 26, 26 . . . have such a width that the melted solder bump 25 can not easily pass the slits 26, 26 . . . . Therefore, a shortage of solder contributing to the connection to the piezoelectric element 2 will never occur in the land sections 24b, 24b . . . .

Figure 9:
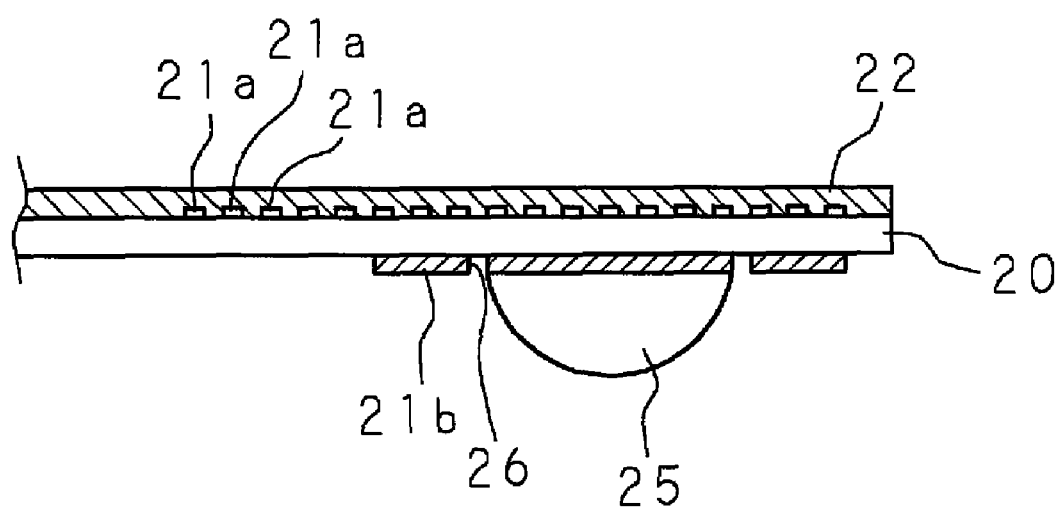
FIG. 9 is a cross sectional view along the IX-IX line of FIGS. 7 and 8.

On the opposite surface of the insulating film 20 where the ground wire 21b is provided, as shown in FIGS. 8 and 9, a plurality of drive wires 21a, 21a . . . are provided. By placing the ground wire 21b on the lower surface of the insulating film 20, it is possible to provide the drive wires 21a, 21a . . . on the upper surface of the corresponding insulating film 20, and it is possible to connect the drive wires 21a, 21a . . . to a larger number of land sections 24a, 24a by using this wire space.

In the inkjet head with the above-described structure, since a plurality of slits 26, 26 . . . are formed in the ground wire 21b and each area enclosed by two slits is the land section 24b, the ground wire 21b and the land sections 24b, 24b . . . are connected by only the thin connection sections 27, 27 . . . . Therefore, when solder is placed and melted in a reflow furnace in the manufacturing step of depositing the solder on the land sections 24b, 24b . . . , the melted solder will not flow from the land sections 24b, 24b . . . to the ground wire 21b. Moreover, since the height and volume of the solder bumps 25 can be maintained even at the stage of connecting the flexible wiring board 1 to the piezoelectric element 2, it is possible to firmly connect the flexible wiring board 1 and the piezoelectric element 2. Further, the reliability of the electrical connection between them is improved.

In this embodiment, although the land sections 24b, 24b . . . have a substantially circular shape, they are not limited to this shape, and may have other shape such as an oval or rectangular shape. Hence, the shape of the slits 26, 26 . . . may be changed to a shape other than a circular arc. Although the structure where the ground wire 21b and the land sections 24b, 24b . . . are connected by two connection sections 27 and 27 is illustrated, it is not limited to this, and may have one connection section, or three or more connection sections. Accordingly, it may be possible to enclose each of the land sections 24b, 24b . . . by one slit 26, or three or more slits 26, 26 . . . , instead of two slits 26, 26. In addition, although the structure where the land sections 24b, 24b . . . are provided in the ground wire 21b is illustrated, it is not limited to this, and, for example, may have the following structure.

MODIFIED EXAMPLE 1

Figure 10:
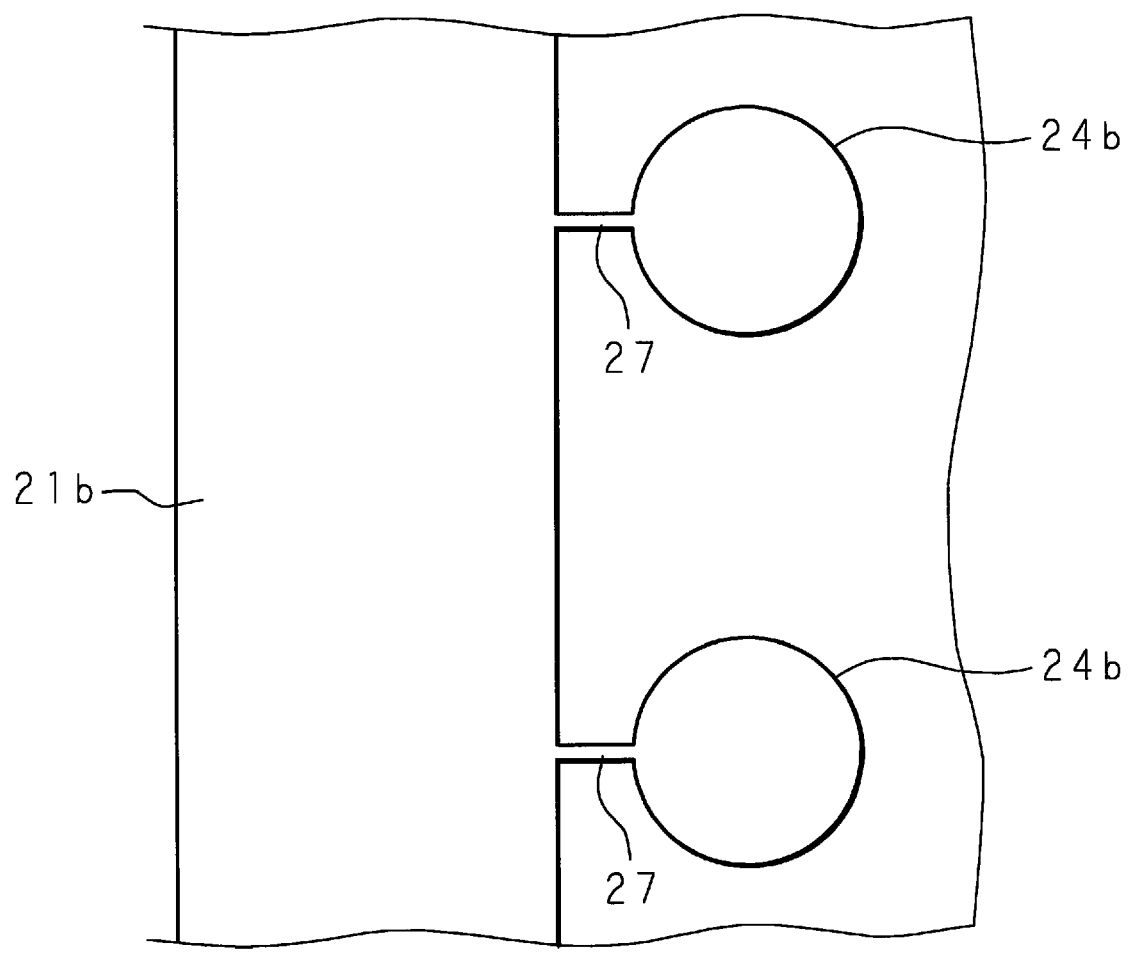
FIG. 10 is an enlarged plan view showing the lower surface of a flexible wiring board according to Modified Example 1.

FIG. 10 is an enlarged plan view of the lower surface of a flexible wiring board 1 according to Modified Example 1, and illustrates an enlarged view of the vicinity of the land sections 24b, 24b . . . formed in the ground wire 21b. On the flexible wiring board 1 according to Modified Example 1, a plurality of substantially circular land sections 24b, 24b . . . are arranged at fixed intervals on the ground wire 21b, and the land sections 24b, 24b . . . and the ground wire 21b are connected with wires (connection sections 27, 27 . . . ) sufficiently thinner compared to the land sections 24b, 24b. . . .

When there is an empty space in the lower surface of the flexible wiring board 1, the above-mentioned structure may be adopted, and, for example, the land sections 24b, 24b . . . may be arranged continuously with at least one end of each line of the land sections 24a, 24a . . . . Thus, even when an external force damaging the connection between the flexible wiring board 1 and the piezoelectric element 2 is applied, it is possible to readily protect the connection section between the flexible wiring board 1 and the individual terminal 2a of the piezoelectric element 2. Regarding this point, a similar effect is also obtained from the above-explained embodiment. Anyway, similarly to the case where the land sections 24b, 24b . . . are provided by forming the slits 26, 26 . . . in the ground wire 21b, when the solder deposited on the land sections 24b, 24b . . . is melted, the melted solder does not flow from the land sections 24b, 24b . . . to the ground wire 21b, and therefore it is possible to firmly connect the flexible wiring board 1 and the piezoelectric element 2.

From the point of view of protecting the connection section between the flexible wiring board 1 and the piezoelectric element 2 (individual terminal 2a) from unnecessary external force, it is preferable in any embodiment that the land sections 24b, 24b . . . are positioned on a line extended from a line of the land sections 24a, 24a . . . , and that the land sections 24b, 24b . . . are arranged up to a position outside the range of the land sections 24a, 24a . . . in the direction of the long side of the flexible wiring board 1 in the edge section along the long side of the flexible wiring board 1.

Further, from the same point of view, it is preferred in the plan view that three sides of the flexible wiring board 1, excluding a side pulled out from the piezoelectric element 2, face the piezoelectric element 2, and that the size of the flexible wiring board 1 is smaller than the piezoelectric element 2. In other words, both end portions in the direction of the short side of the flexible wiring board 1 where the land sections 24a are arranged and an end portion opposite to the connection terminals 1a, 1a . . . are both placed on the piezoelectric element 2. Accordingly, when the flexible wiring board 1 is connected to the piezoelectric element 2, a portion that sticks out of the piezoelectric element 2 is limited to the pull-out side of the flexible wiring board 1. Therefore, after connecting the flexible wiring board 1 and the piezoelectric element 2, an external force acting to separate them is hardly applied directly to the flexible wiring board 1. The positional relationship between the flexible wiring board 1 and the piezoelectric element 2 is shown in FIGS. 3A and 3B. In FIGS. 3A and 3B, for example, a position where the piezoelectric element 2 is placed when the piezoelectric element 2 is connected to the flexible wiring board 1 is indicated by an alternate long and two short dashes line.

The inkjet head with the above-described structure comprises a channel unit 3 having a plurality of ink ejection outlets for ejecting an ink and a plurality of ink pressure chambers connected to the respective ink ejection outlets, the plurality of ink pressure chambers being arranged in a plurality of lines on one surface; a piezoelectric element 2 having a plurality of connection terminals (individual terminals 2a) provided at positions corresponding to the respective ink pressure chambers and fastened to one surface of the channel unit 3 to change the capacity of each ink pressure chamber; a driving IC 4 as a drive element for outputting a drive voltage for changing the capacity of the ink pressure chamber; and a flexible wiring board 1 having a plurality of wires for supplying the drive voltage from the driving IC 4 to a plurality of individual terminals 2a, the plurality of wires being connected respectively to the corresponding individual terminals 2a. Further, the flexible wiring board 1 is a flexible wiring board having the above-mentioned structure, and characterized in that the land sections of the flexible wiring board 1 are connected to the corresponding individual terminals 2a, the driving IC 4 is positioned on the connection terminals 1a, 1a . . . side in a direction crossing the extending direction of a terminal land line composed of a plurality of terminal lands, and the width of the piezoelectric element 2 is not shorter than the width of the facing flexible wiring board 1 in the extending direction of a line of the land sections (the direction of the short side of the flexible wiring board 1).

The embodiment which is applied to the inkjet head has been described above, however, it is not limited to the above-mentioned embodiment. Instead of the piezoelectric element, an actuator which performs electoro-thermal conversion may be connected to the board. Also, the present embodiment may be applied to the structure where an element such as an IC is connected on the board, and further may be applied to the structure where the first board is connected to the second board.

In this embodiment, a land section enclosed by slits is formed in the wire, and the wire and the land section are connected at the connection section provided between the ends of the slit. Therefore, the land section that needs to have a certain area for placing an electrically conductive brazing filler metal is contained in the wire, and the wire area is not narrowed by the land section. Further, it is possible to provide wires on both surfaces of the wiring board and it is possible to increase the number of drive wires, without increasing the size of the wiring board. Alternatively, it is possible to decrease the size of the wiring board.

In this embodiment, the ground wire is provided on a side of the wiring board to which the piezoelectric element is connected, and the drive wires are provided on the opposite side. Thus, an electrically conductive brazing filler metal is not placed on the surface of the wiring board where the drive wires are provided. Therefore, when the wiring board and the piezoelectric element are connected, there is no possibility of a short circuit of the drive wires due to the melted electrically conductive brazing filler metal. Further, it is possible to prevent an increase in the defect ratio in the step of connecting the wiring board and the piezoelectric element.

In this embodiment, the ground wire is provided on the edge of the wiring board, a plurality of land sections are formed in the ground wire, and the wiring board and the piezoelectric element are connected by a plurality of land sections at the edge of the wiring board. Thus, the wiring board can be electrically connected to the piezoelectric element in a highly reliable manner, and can also be mechanically fastened to the piezoelectric element firmly. Moreover, since the piezoelectric element is connected to the ground wire provided on the edge of the wiring board through a plurality of land sections, a force damaging the connection section is hardly applied directly to a plurality of connection sections in the middle of the wiring board. In other words, there is a low possibility that the wiring board may be separated from the piezoelectric element, and it is possible to reduce defects due to separation in the manufacturing steps after connecting the wiring board and the piezoelectric element.

In this embodiment, like the wire for ground potential, a wire wider than a wire for transmitting a drive voltage is provided on a surface different from a surface on which the wires for transmitting the drive voltage are provided, and thus an extra wire space is produced for the wires for transmitting the drive voltage. It is therefore possible to provide a larger number of wires for transmitting the drive voltage. Alternatively, it may be possible to decrease the size of the wiring board by an amount corresponding to the area occupied by the wire for the ground potential. In any case, even when the number of piezoelectric elements that are driven simultaneously is increased, the wires can supply at least a sufficient drive current. In addition, it is possible to reduce the cost of the wiring board.

As this description may be embodied in several forms without departing from the spirit of essential characteristics thereof, the present embodiment is therefore illustrative and not restrictive, since the scope is defined by the appended claims rather than by the description preceding them, and all changes that fall within metes and bounds of the claims, or equivalence of such metes and bounds thereof are therefore intended to be embraced by the claims.

The invention claimed is:

1. An inkjet head comprising:
    a piezoelectric element with a plurality of connecting terminal sections for producing pressure to eject an ink;
    a wiring board having an insulating film, a plurality of wires provided on the insulating film, and land sections connected to the wires; and
    electrically conductive brazing filler metals for connecting the terminal sections of the piezoelectric element and the land sections of the wiring board respectively,
    wherein the wires and the land sections are provided on both surfaces of the insulating film, and the piezoelectric element is connected to the land section on one surface of the insulating film through the electrically conductive brazing filler metal,
    the land section provided on the one surface is connected to the wire through a connection section thinner than the land section and the wire connected to the land section,
    the wire provided on the one surface has a width wider than a width of the wire provided on a other surface of the insulating film, and
    one or a plurality of the wires on the other surface are provided to face the wire on the one surface with the insulating film therebetween.

2. The inkjet head according to claim 1, wherein the land section on the one surface is enclosed by one or a plurality of slits formed in the wire, and
    the connection section is provided between ends of the slit.

3. The inkjet head according to claim 1, wherein the wire provided on the one surface is a wire for ground potential.

4. The inkjet head according to claim 1, wherein a plurality of the land sections on the one surface are provided, and the land sections are arranged in the wire provided on the one surface along the wire on the one surface.

5. The inkjet head according to claim 1, wherein a plurality of the land sections on the one surface are provided, and the land sections are arranged at fixed intervals in the wire provided on the one surface.

6. The inkjet head according to claim 3, wherein the wire for ground potential is placed on an edge of the insulating film, and connected to a plurality of the land sections.

7. The inkjet head according to claim 4, wherein a plurality of the connection sections are provided, and the connection sections are formed at a substantially middle in a width direction of the wire provided on the one surface, and arranged in a line along an extending direction of the wire on the one surface.

8. A connection structure of a wiring board comprising:
    a member with a plurality of connecting terminal sections;
    the wiring board having an insulating section, a plurality of wires provided on the insulating section, and land sections connected to the wires; and
    electrically conductive brazing filler metals for connecting the terminal sections of the member and the land sections of the wiring board respectively,
    wherein the wires and the land sections are provided on both surfaces of the insulating section, and the member is connected to the land section on one surface of the insulating section through the electrically conductive brazing filler metal,
    the land section provided on the one surface is connected to the wire through a connection section thinner than the land section and the wire connected to the land section,
    the wire provided on the one surface has a width wider than a width of the wire provided on a other surface of the insulating section, and
    one or a plurality of the wires on the other surface are provided to face the wire on the one surface with the insulating section therebetween.

9. The connection structure of the wiring board according to claim 8, wherein the insulating section is an insulating film.

10. An inkjet head comprising:
    a member with a plurality of connecting terminal sections;
    a wiring board having an insulating section, a plurality of wires provided on the insulating section, and land sections connected to the wires; and
    electrically conductive brazing filler metals for connecting the terminal sections of the member and the land sections of the wiring board respectively,
    wherein the wires and the land sections are provided on both surfaces of the insulating section and the member is connected to the land section on one surface of the insulating section through the electrically conductive brazing filler metal,
    the land section provided on the one surface is connected to the wire through a connection section thinner than the land section and the wire connected to the land section,
    the member is an actuator for producing pressure to eject an ink,
    the wire provided on the one surface has a width wider than a width of the wire provided on a other surface of the insulating section, and
    one or a plurality of the wires on the other surface are provided to face the wire on the one surface with the insulating section therebetween.

* * * * *